United States Patent
Zhu et al.

(10) Patent No.: US 9,947,528 B2
(45) Date of Patent: Apr. 17, 2018

(54) STRUCTURE AND METHOD FOR NFET WITH HIGH K METAL GATE

(71) Applicant: Taiwan Semiconductor Manufacturing Company, Ltd., Hsin-Chu (TW)

(72) Inventors: Ming Zhu, Singapore (SG); Jin-Aun Ng, Hsinchu (TW); Chi-Wen Liu, Hsinchu (TW)

(73) Assignee: TAIWAN SEMICONDUCTOR MANUFACTURING COMPANY, LTD., Hsin-Chin (TW)

( * ) Notice: Subject to any disclaimer, the term of this patent is extended or adjusted under 35 U.S.C. 154(b) by 0 days.

(21) Appl. No.: 14/487,252

(22) Filed: Sep. 16, 2014

(65) Prior Publication Data

US 2015/0004779 A1 Jan. 1, 2015

Related U.S. Application Data (62) Division of application No. 13/448,846, filed on Apr. 17, 2012, now abandoned.

(51) Int. Cl.
*H01L 21/8234* (2006.01)
*H01L 29/66* (2006.01)
(Continued)

(52) U.S. Cl.
CPC ...... *H01L 21/022* (2013.01); *H01L 21/02337* (2013.01); *H01L 21/02362* (2013.01);
(Continued)

(58) Field of Classification Search
CPC . H01L 29/165; H01L 29/4958; H01L 29/517; H01L 29/66545; H01L 29/66636;
(Continued)

(56) References Cited

U.S. PATENT DOCUMENTS 6,228,714 B1    5/2001  Choi
6,674,111 B2    1/2004  Nakabayashi
(Continued)

FOREIGN PATENT DOCUMENTS

CN    102013424    4/2011
JP    2003179169 A  6/2003
(Continued)

OTHER PUBLICATIONS

Korean Intellectual Property Office, Korean Office Action dated Nov. 30, 2015 for Application No. 10-2015-0130957, 11 pages.

*Primary Examiner* — Natalia Gondarenko
(74) *Attorney, Agent, or Firm* — Haynes and Boone, LLP (57) ABSTRACT

The present disclosure provides an integrated circuit. The integrated circuit includes a semiconductor substrate; a n-type filed effect transistor (nFET) formed on the semiconductor substrate and having a first gate stack including a high k dielectric layer, a capping layer on the high k dielectric layer, a p work function metal on the capping layer, and a polysilicon layer on the p work function metal; and a p-type filed effect transistor (pFET) formed on the semiconductor substrate and having a second gate stack including the high k dielectric layer, the p work function metal on the high k dielectric layer, and a metal material on the p work function metal.

17 Claims, 7 Drawing Sheets

(51) Int. Cl.
*H01L 21/02* (2006.01)
*H01L 21/8238* (2006.01)
*H01L 29/49* (2006.01)
*H01L 29/51* (2006.01)
*H01L 29/78* (2006.01)
*H01L 29/165* (2006.01)
*H01L 21/28* (2006.01)
*H01L 21/3205* (2006.01)
*H01L 27/092* (2006.01)

(52) U.S. Cl.
CPC .......... *H01L 21/28008* (2013.01); *H01L 21/823842* (2013.01); *H01L 21/823857* (2013.01); *H01L 29/165* (2013.01); *H01L 29/4958* (2013.01); *H01L 29/517* (2013.01); *H01L 29/66545* (2013.01); *H01L 29/66636* (2013.01); *H01L 29/7848* (2013.01)

(58) Field of Classification Search
CPC .......... H01L 29/78; H01L 29/7848; H01L 29/823857; H01L 21/022; H01L 21/02362; H01L 21/02337; H01L 21/20; H01L 21/28008; H01L 27/11; H01L 27/0629; H01L 21/823857; H01L 21/823842; H01L 21/823443; H01L 21/823437; H01L 27/00; H01L 27/092; H01L 27/0203; H01L 27/0218; H01L 27/085; H01L 27/088; H01L 27/0617; H01L 2924/047; H01L 2924/1207; H01L 29/66606; H01L 29/66871; H01L 29/66583; H01L 21/28088; H01L 21/28079; H01L 21/31051; H01L 21/82345
USPC ....... 257/369, 392, 350, 360, 364, 368, 393, 257/337, 531, E29.226, E21.616, 288, 257/379, 410, 192, 330, 408; 438/384, 438/591, 592, 183, 171, 190, 210, 238, 438/275, 300, 285, 329
See application file for complete search history.

(56) References Cited

U.S. PATENT DOCUMENTS

| | | | | |
|---|---|---|---|---|
| 7,071,052 B2 * | 7/2006 | Yeo | ............ | H01L 28/20 257/E21.004 |
| 8,252,675 B2 * | 8/2012 | Lee | ............ | H01L 21/28088 257/E21.177 |
| 8,563,411 B2 | 10/2013 | Lim et al. | | |
| 8,685,827 B2 * | 4/2014 | Kim | ............ | H01L 21/82345 438/238 |
| 2002/0024076 A1 | 2/2002 | Nakabayashi | | |
| 2003/0054612 A1 | 3/2003 | Cho et al. | | |
| 2007/0295989 A1 * | 12/2007 | Han | ............ | H01L 29/78 257/192 |
| 2008/0173947 A1 * | 7/2008 | Hou | ............ | H01L 21/82383 257/369 |
| 2008/0272457 A1 * | 11/2008 | Anderson | ............ | H01L 21/82348 257/531 |
| 2009/0026551 A1 * | 1/2009 | Nakagawa | ............ | H01L 21/82380 257/374 |
| 2009/0101943 A1 | 4/2009 | Miyashita | | |
| 2009/0108373 A1 * | 4/2009 | Frank | ............ | H01L 27/11 257/392 |
| 2009/0181505 A1 * | 7/2009 | Ando | ............ | H01L 21/28088 438/216 |
| 2009/0302364 A1 * | 12/2009 | Duarte de Martin | ... | H01L 23/64 257/296 |
| 2010/0001369 A1 * | 1/2010 | Chuang | ............ | H01L 21/8249 257/526 |
| 2010/0013026 A1 | 1/2010 | Booth et al. | | |
| 2010/0032770 A1 * | 2/2010 | Park | ............ | H01L 23/367 257/379 |
| 2010/0044803 A1 | 2/2010 | Chen et al. | | |
| 2010/0052063 A1 * | 3/2010 | Masuoka | ............ | H01L 21/28061 257/369 |
| 2010/0109088 A1 * | 5/2010 | Ng | ............ | H01L 21/82380 257/369 |
| 2010/0148262 A1 | 6/2010 | Stahrenberg et al. | | |
| 2011/0057267 A1 * | 3/2011 | Chuang | ............ | H01L 21/82384 257/380 |
| 2011/0081774 A1 | 4/2011 | Yeh et al. | | |
| 2011/0269276 A1 * | 11/2011 | Kwon | ............ | H01L 21/82380 438/199 |
| 2011/0316044 A1 | 12/2011 | Chan et al. | | |
| 2012/0217588 A1 * | 8/2012 | Vega | ............ | H01L 29/0847 257/408 |
| 2013/0087855 A1 * | 4/2013 | Makiyama | ............ | H01L 21/84 257/350 |
| 2013/0270647 A1 | 10/2013 | Zhu | | |

FOREIGN PATENT DOCUMENTS

| | | |
|---|---|---|
| KR | 20120012705 A | 2/2012 |
| TW | 201013931 | 4/2010 |
| TW | 201019381 | 5/2010 |

* cited by examiner

STRUCTURE AND METHOD FOR NFET WITH HIGH K METAL GATE

PRIORITY DATA

This application is a Divisional of U.S. patent application Ser. No. 13/448,846, filed Apr. 17, 2012, which is hereby incorporated by reference in its entirety.

BACKGROUND

Field effect transistors (FETs) have been used in conventional integrated circuit (IC) design. Due to shrinking technology nodes, high-k dielectric material and metal are often considered to form a gate stack for a FET. Integration issues exist when forming various metal-gate FETs onto a single IC chip, especially when resistors are integrated in an IC circuit. One issue is related with dishing effect during a polishing process. In another example, a gate replacement process includes an etch process to remove the polysilicon gate. However, the formed polysilicon resistors can be damaged and recessed by the etch process, causing the deviation of the resistance of the polysilicon resistor from the designed target. Therefore, a structure integrated with high k metal gate a method making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
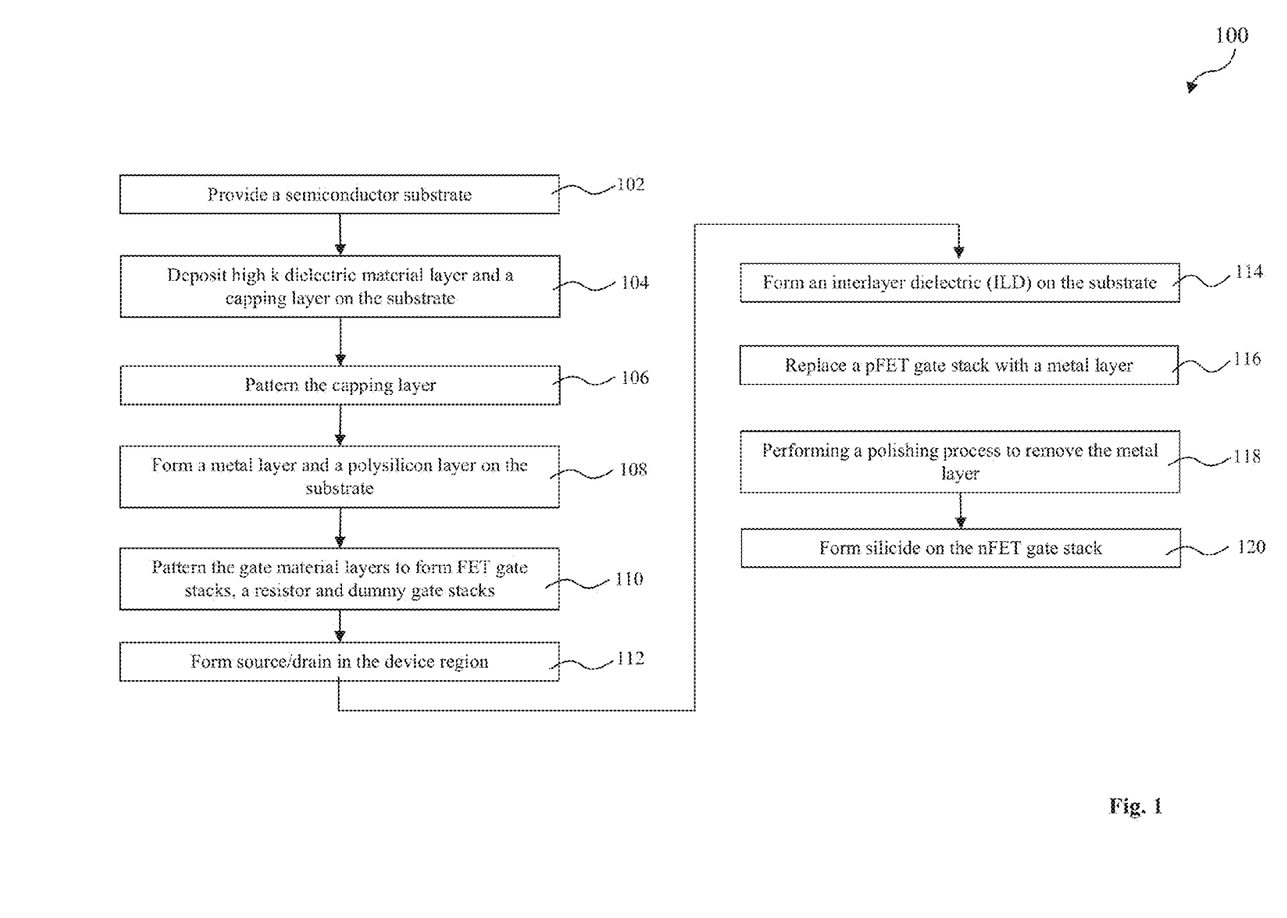
FIG. 1 is a flowchart of a method making a semiconductor device having a metal gate stack and a polysilicon stack constructed according to various aspects of the present disclosure.

FIG. 1 is a flowchart of a method 100 for making a semiconductor device according to one embodiment. FIGS. 2 through 7 are sectional views of a semiconductor structure 200 at various fabrication stages and constructed according to one or more embodiments. The semiconductor structure 200 includes various gate stacks, such as a polysilicon gate stack for an n-type FET and a metal gate stack for p-type FET. In the present embodiment, the semiconductor structure 200 further includes a polysilicon resistor constructed according to various aspects of the present disclosure. The semiconductor structure 200 and the method 100 are collectively described with reference to FIGS. 1 through 7.

Figure 2:
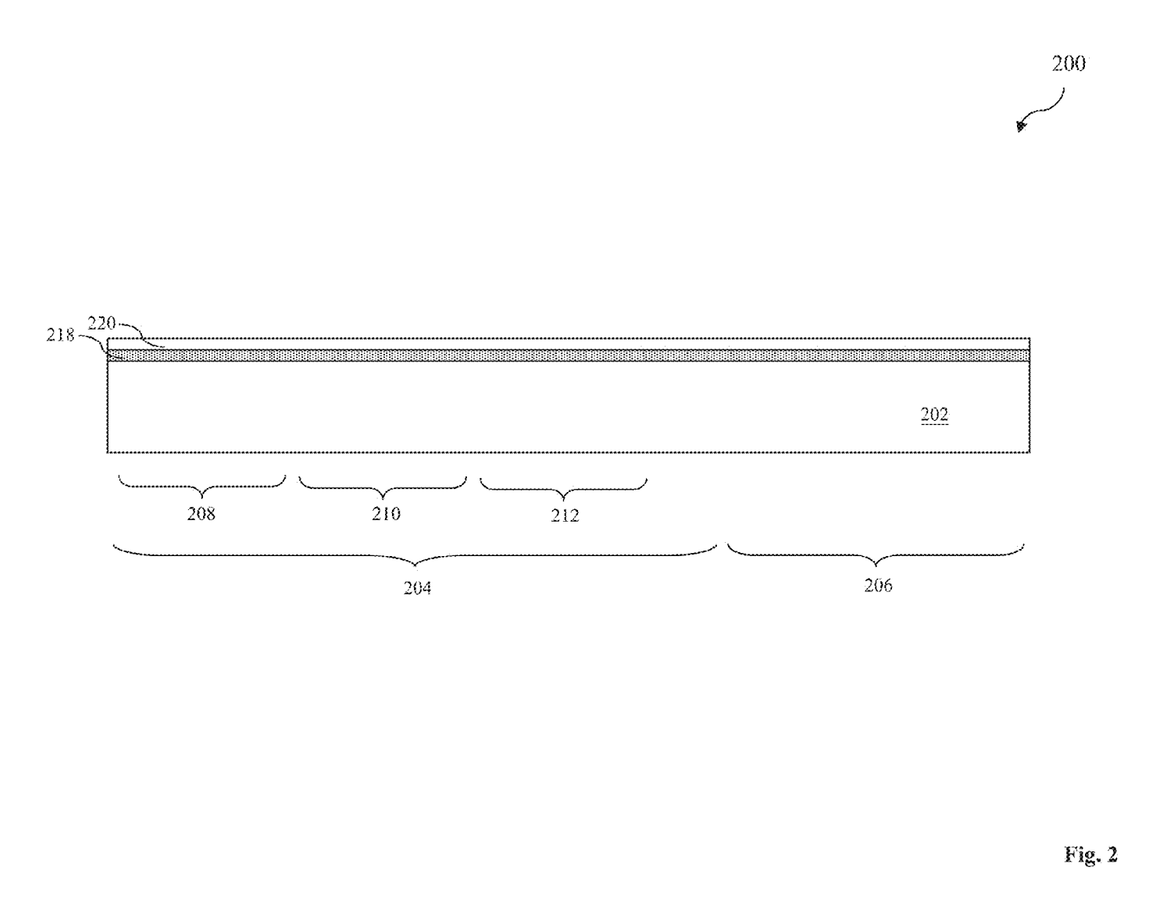
FIGS. 2-7 are sectional views of one embodiment of a semiconductor structure having a metal gate stack and a polysilicon stack at various fabrication stages constructed according to various aspects of the present disclosure.

Referring to FIGS. 1 and 2, the method 100 begins at step 102 by providing a semiconductor substrate 202. The semiconductor substrate 202 includes silicon. Alternatively, the substrate includes germanium, silicon germanium or other proper semiconductor materials. The semiconductor substrate 202 also includes various isolation features such as shallow trench isolation (STI) formed in the substrate to separate various devices.

The formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor substrate 202 also includes various doped features, such as n-wells and p-wells formed in various active regions. Those doped features are formed by suitable techniques, such as ion implantation.

In one embodiment, the semiconductor substrate 202 includes a first region 204 for various devices and a second region 206 with no or less functional devices. The various devices in the first region include various n-type and p-type field-effect transistors and one or more polysilicon resistors. In the present embodiment, the first region 204 includes a device region 208 for an exemplary n-type FET (nFET), a device region 210 for an exemplary p-type FET (pFET), and a device region 212 for a resistor of high resistance.

Still referring to FIGS. 1 and 2, the method 100 proceeds to step 104 by forming a gate dielectric layer 218 and a capping layer 220. The gate dielectric layer 218 is formed on the semiconductor substrate 202. In the present embodiment, the gate dielectric layer 218 includes a high-k dielectric material. The high-k dielectric material includes a dielectric material having the dielectric constant higher than that of thermal silicon oxide, which is about 3.9. In one example, the high-k dielectric material includes hafnium oxide (HfO). In various examples, the high-k dielectric material includes metal oxide, metal nitride, or combinations thereof. In one example, the gate dielectric layer 218 of high k dielectric material may be formed by chemical vapor deposition (CVD), atomic layer deposition (ALD), plasma enhanced CVD (PE CVD), or plasma enhanced ALD (PEALD). In another example, the gate dielectric layer 218 of high-k dielectric material includes a thickness ranging between about 10 angstrom and about 100 angstrom.

In another embodiment, the gate dielectric layer 218 further includes an interfacial layer (IL) disposed between the high-k dielectric material film and the semiconductor substrate 202. In one example, the interfacial layer includes silicon oxide formed by a suitable technique, such as thermal oxidation. The interfacial layer may be formed by other technique, such as ALD or CVD.

The capping layer 220 is formed on the gate dielectric layer 218. The capping layer 220 prevents the metal diffusion from gate electrodes to the gate dielectric layer. In the present embodiment, the capping layer 220 is one of the materials to form a work function material for nFET. The work function material for nFET has a proper work function such that the threshold voltage of the nFET is reduced. When the substrate 202 is a silicon substrate, the work function material for nFET has a work function close to the silicon conduction band (Ec) or lower work function. For example, the work function material for nFET has a work function about 4.2 eV or less. In the present embodiment, the capping layer 220 includes lanthanum oxide (LaO). The capping layer 220 is formed by a suitable technique, such as CVD, PVD or other method.

Figure 3:
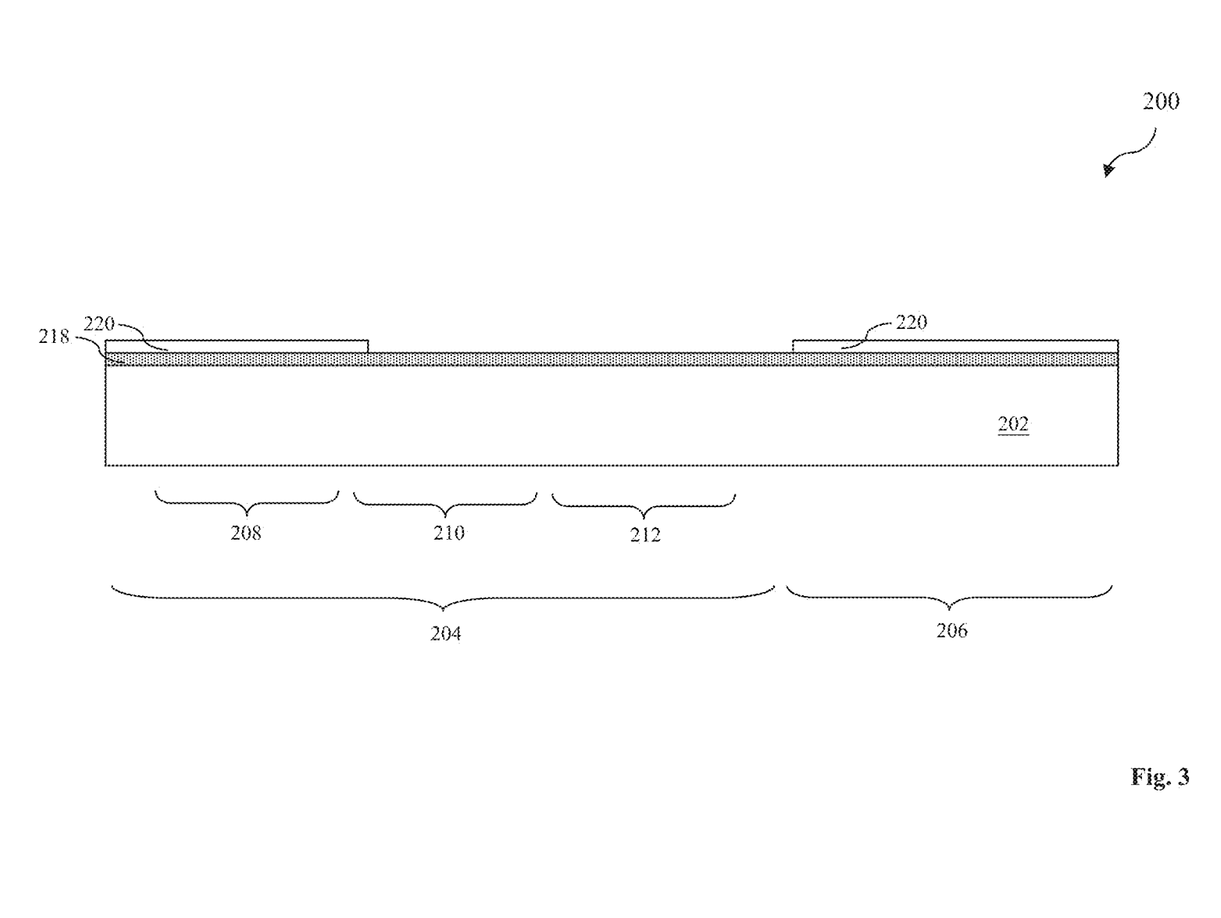

Referring to FIGS. 1 and 3, the method 100 proceeds to step 106 by patterning the capping layer 220 using a procedure including a lithography process. An exemplary lithography process may include photoresist patterning, etching, and photoresist stripping. The photoresist patterning may further include processing steps of coating, exposing pattern, post-exposure baking, and developing photoresist. The etching uses a proper etchant to selectively remove the capping layer 220. In the present embodiment where the capping layer 220 includes LaO film, the etchant may include HCl or weak acid ($CO_2$ water).

In one embodiment, the capping layer 220 is patterned such that the patterned capping layer 220 covers the device region 208 for nFET and exposes the device region 210 for pFET. Furthermore, the patterned capping layer 220 covers the second region 206 where one or more dummy gate stacks are to be formed to adjust the pattern density for improved etching effect. By keeping the LaO layer 220 in the second region 206, the etch bias associated with the loading effect in the lanthanum oxide etch process is reduced.

Figure 4:
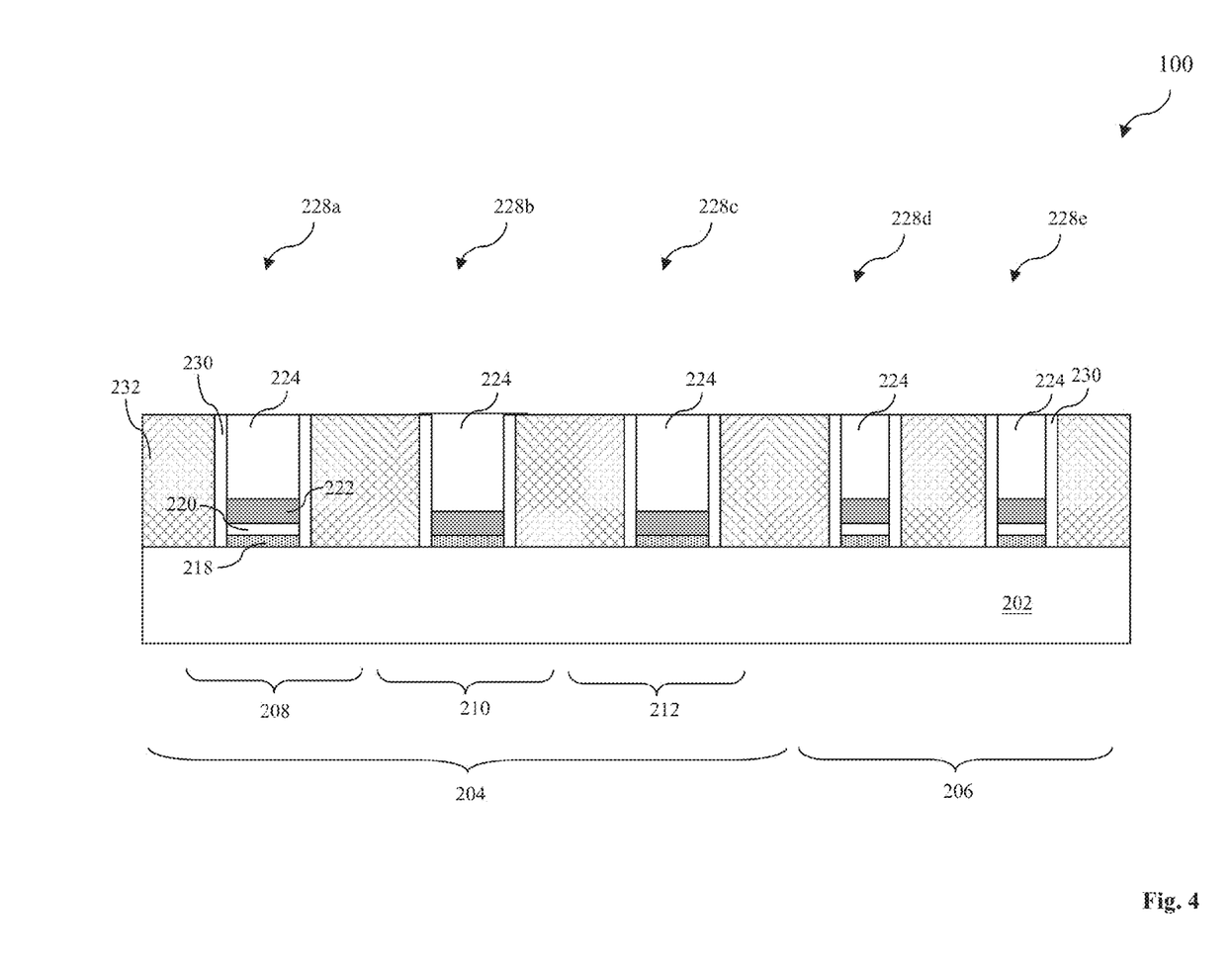

Referring to FIGS. 1 and 4, the method 100 proceeds to step 108 by forming a metal layer 222 and polysilicon layer 224. The metal layer 222 is chosen to have a proper work function for the pFET, also referred to as p work function metal (or p metal). A p type work function metal is a metal or metal alloy having a work function such that the threshold voltage of the associated pFET is reduced. The p work function metal has a work function close to the silicon valence band energy (Ev) or higher work function, presenting strong electron bonding energy to the nuclei. For example, the p work function metal has a work function of about 5.2 eV or higher.

The metal layer 222 is further properly chosen such that the capping layer 220 and the metal layer 222 together form a material layer with a work function close to 4.2 eV or less. In the present embodiment, the metal layer 222 includes titanium nitride (TiN) formed by a suitable technique, such as PVD. In other embodiments, the metal layer 222 includes tantalum nitride (TaN), tungsten nitride (WN), or combinations thereof.

The polysilicon (or amorphous silicon) layer 224 may be formed by CVD with precursor silane ($SiH_4$) or other silicon based precursor. The deposition of the amorphous silicon may be performed at a raised temperature. In one example, the deposition temperature is greater than about 400° C. The polysilicon (or amorphous) layer 224 may be in situ doped using the precursor including dopant-containing gas according to one embodiment.

Still referring to FIGS. 1 and 4, the method 100 proceeds to step 110 by patterning the gate material layers to form various patterned stacks 228 including transistor gate stacks, one or more resistor, and one or more dummy gate. The gate material layers include gate dielectric layer 218, (the capping layer 220,) the p metal layer 222, the polysilicon layer 224. In the present embodiment, one gate stack 228a for nFET is formed in the device region 208 and includes the capping layer 220 and the metal layer 222. One gate stack 228b for pFET is formed in the device region 210 and includes the metal layer 222. A resistor 228c with a material stack same to the pFET gate stack 228b is formed in the device region 212. Two exemplary dummy gate stacks 228d and 228e with material stacks same to the nFET gate stack 228a are formed in the second region 206.

The patterning process to form gate stacks and resistor include a lithography patterning process. For example, the patterning process includes forming a patterned photoresist, etching, and photoresist stripping. In another embodiment, the patterning process may further use a hard mask as an etch mask. In this case, a hard mask layer is formed on the gate material layers; a patterned photoresist layer is formed on the hard mask; a first etch process is applied to the hard mask to transfer the pattern from the patterned photoresist to the hard mask; and a second etch process is applied to the gate material layers using the patterned hard mask as an etch mask. In the present embodiment, the hard mask layer includes a silicon oxide ($SiO_2$) layer and a silicon nitride (SiN) layer on the silicon oxide. SiN or SiO2 can be formed by CVD or other suitable technique.

In one embodiment, the resistive stack 228c is formed as a passive device. This passive device may be used as a resistor or alternatively used as a polysilicon fuse. In another embodiment, the resistor 228c is disposed on one STI feature. In another embodiment, the resistor 228c is substantially disposed in the active region of the substrate 202. Alternatively, the resistor can be partially on the active region and partially on the STI feature. In another embodiment, an ion implantation may be applied to the resistor 228c to introduce doping species and adjust its resistance.

Still referring to FIGS. 1 and 4, the method 100 proceeds to step 112 by forming source and drain features on the semiconductor substrate 202. In one embodiment, the source and drain features include light doped drain (LDD) regions and heavily doped source and drain (S/D), collectively referred to as source and drain features, formed by one or more implantation processes. When the first region 204 includes both a nFET in the device region 208 and a pFET in the device region 210, the source and drain regions are formed, respectively, for the nFET and pFET, using proper doping species. In one embodiment, taking n-type FETs as an example, the LDD features are formed by an ion implantation with a light doping dose. Thereafter, spacers 230 are formed by dielectric deposition and anisotropic etch, such as plasma etch. Then the heavily doped S/D features are formed by an ion implantation with a heavy doping dose. The various source and drain features of the p-type FETs can be formed in a similar procedure but with opposite doping type.

The sidewall spacer 230 on the sidewalls of the resistor 228c may be formed simultaneously during the process to form the spacers of nFETs and the pFETs. During various doping processes to form various source and drain features, the resistor region 212 is protected by a mask layer, such as a patterned photoresist layer. In one embodiment of the procedure to form various source and drain features for both nFETs and pFETs, the LDD features of nFETs are formed by an ion implantation while the regions of pFETs and the resistors are covered by a patterned photoresist layer; the LDD features of pFETs are formed by an ion implantation while the regions of nFETs and the resistors are covered by another patterned photoresist layer; then spacers are formed to nFET gate stacks, pFET gate stacks and resistors by deposition and etch; the S/D features of nFETs are formed by ion implantation while the regions of pFETs and the resistors are covered by another patterned photoresist layer; and the S/D features of pFETs are formed by ion implantation while the regions of nFETs and the resistors are covered by another patterned photoresist layer.

In one embodiment, a high temperature annealing process is followed to activate the various doping species in the source and drain regions and the resistors. In another embodiment, the thermal annealing process is applied to the semiconductor substrate 202 to further react the capping layer 220 with the metal layer 222, forming a work function metal for nFET in the device region 208.

Still referring to FIGS. 1 and 4, the method 100 proceeds to step 114 by forming an inter-level dielectric (ILD) layer 232 (also referred to as ILD0). The ILD layer 232 is first formed on the semiconductor substrate 202. The ILD layer 232 includes silicon oxide, low k dielectric material, other suitable dielectric materials, or combinations thereof. The ILD layer 232 is formed by a suitable technique, such as CVD. For example, a high density plasma CVD may be implemented to form the ILD layer 232. In one embodiment, the ILD layer 232 is deposited on the substrate 202, and fills in the gaps between the resistor and the gate stacks 228a and 228b. In furtherance of the embodiment, the ILD layer 232 is formed on the substrate to a level above the top surface of the resistors and the gate stacks.

A chemical mechanical polishing (CMP) process is applied to the ILD layer 232 to reduce the thickness of the ILD layer 232 such that the resistors and the gate stacks are exposed from the top side. The processing conditions and parameters of the CMP process, including slurry chemical and polishing pressure, can be tuned to partially remove and planarize the ILD layer 232.

Figure 5:
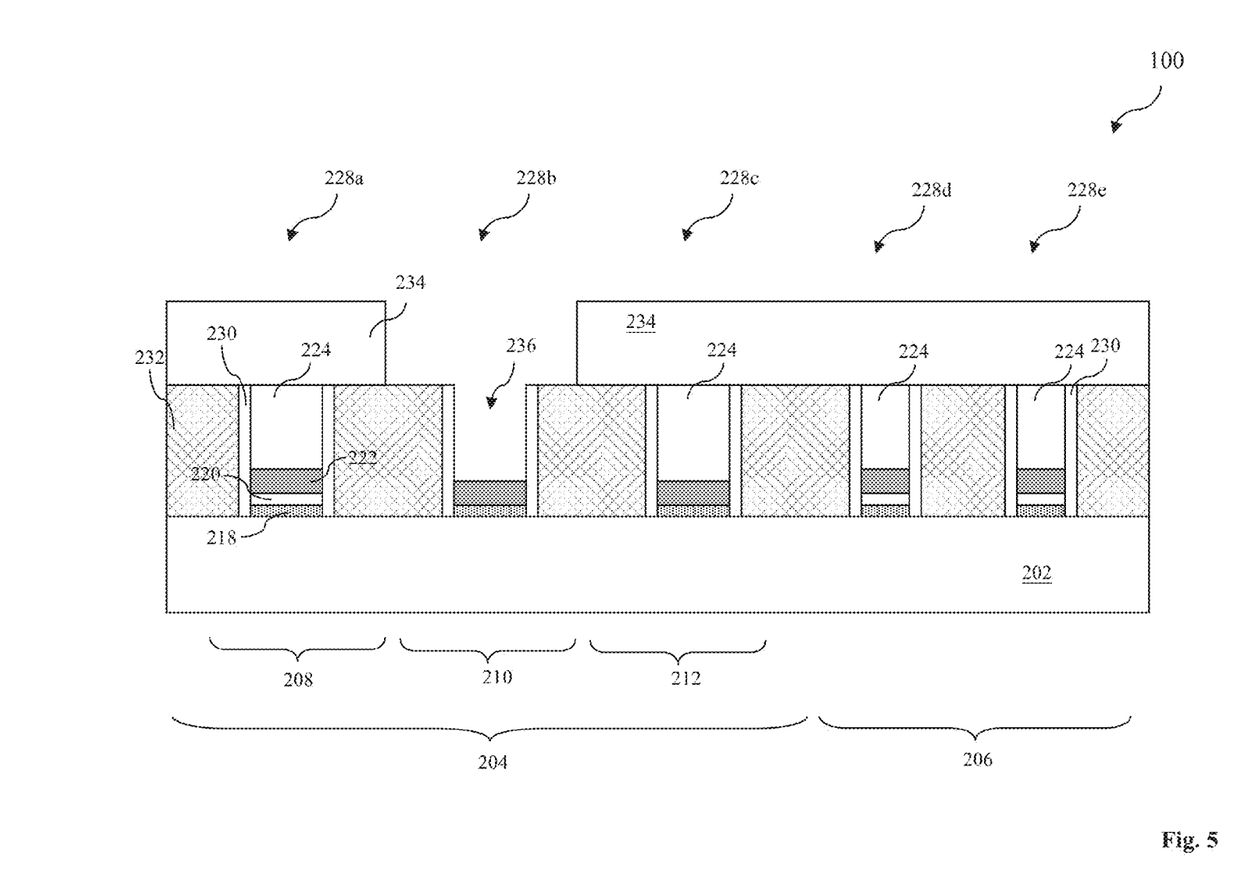

Referring to FIGS. 1 and 5, the method 100 proceeds to step 116 by replacing the polysilicon gate stack 228b in the device region 210 with a metal gate. A patterned photoresist layer 234 is formed on the substrate 202. The patterned photoresist layer 234 includes one or more openings to expose the gate stack 228b in the device region 210.

First, an etch process is applied to remove the polysilicon or amorphous silicon of the dummy gates 228b within the device region 210. If the hard mask is used to form gate stacks 228, the etch process removes the hard mark as well. In one embodiment, the etch process includes two steps wherein the first step is designed to remove the hard mask and the second step is designed to remove the polysilicon 224 in the device region 210. After the polysilicon in the device region 210 is removed, a trench 236 is formed in the device region 210 and is referred to as a gate trench. The etching process used to remove the polysilicon (or amorphous silicon) of the gate stack 228b in the device region 210 may implement suitable dry etching, wet etching or combinations thereof. In one example, an etching solution including HNO3, H2O and HF, or NH4OH solution may be used to remove polysilicon (or amorphous silicon). In another example, chlorine (Cl)-based plasma may be used to selectively remove the polysilicon.

Figure 6:
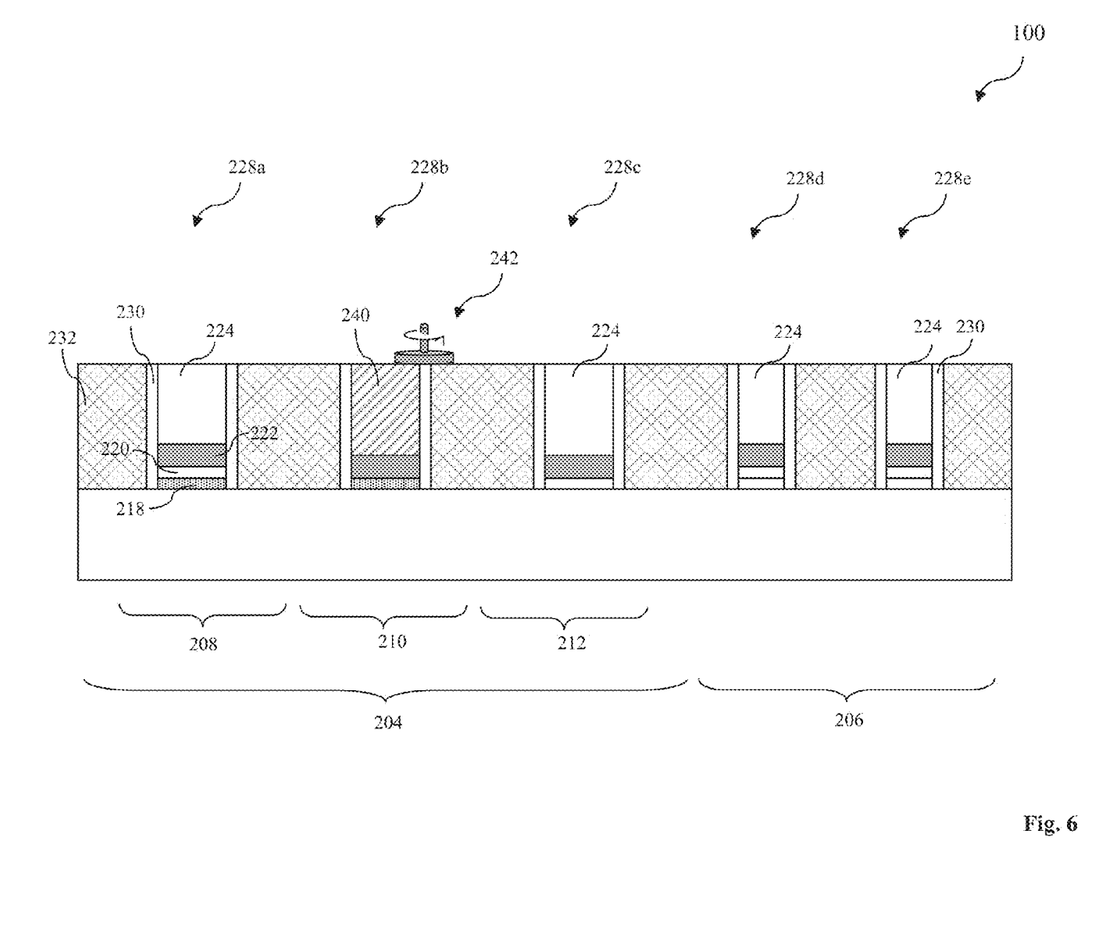

Then, one or more metal material layer 240 are formed in the gate trench 236, as illustrated in FIG. 6. The metal material layer 240 is substantially fills in the gate trench. The metal material layer 240 includes aluminum, copper or tungsten according to various embodiments. The method to form the metal material 240 may include PVD, CVD, ALD, PECVD, PEALD or spin-on metal. Alternatively, the metal material layer 240 may further include other metal or metal alloy films, such as an additional capping layer or a buffer layer.

Still referring to FIGS. 1 and 6, the method 100 proceeds to step 118 by performing a CMP process 242 to remove the excessive metal material 240 disposed on the ILD layer 232. The CMP process 242 is tuned to effectively polish the metal material 240. The gate stack 228a for the nFET in the device region 208 is formed by a gate-first approach. The resistor 228c in the device region 212 is formed with the gate stack 228a. Both the gate stack 228a and the resistor 228c have polysilicon surfaces that may be damaged by the CMP process 242, causing the height variation and performance degradation. Since the dummy gate stacks (e.g., 228d and 228e) are formed with the gate stack 228a by the gate first process, which provides polysilicon surfaces and a uniformed polysilicon pattern density. During the CMP process, the overall metal gate density is not too high, and the dishing effect during the CMP process is substantially suppressed.

Furthermore, by implementing the disclosed hybrid process where the nFET gate stack is formed by the gate first process and the pFET gate stack is formed by the gate last process, the nFET gate stack 228a has a better tuned work function for nFET in the device region 208 and the gate stack 228b has a better tuned work function for pFET in the device region 210. Particularly, when the gate stack 228b for pFET in the device region 210 is formed by the gate last process with replaced metal gate, the metal layer 222 in the gate stack 228b is not unexpectedly tuned by the thermal annealing process during the formation of the source and drain features.

Figure 7:
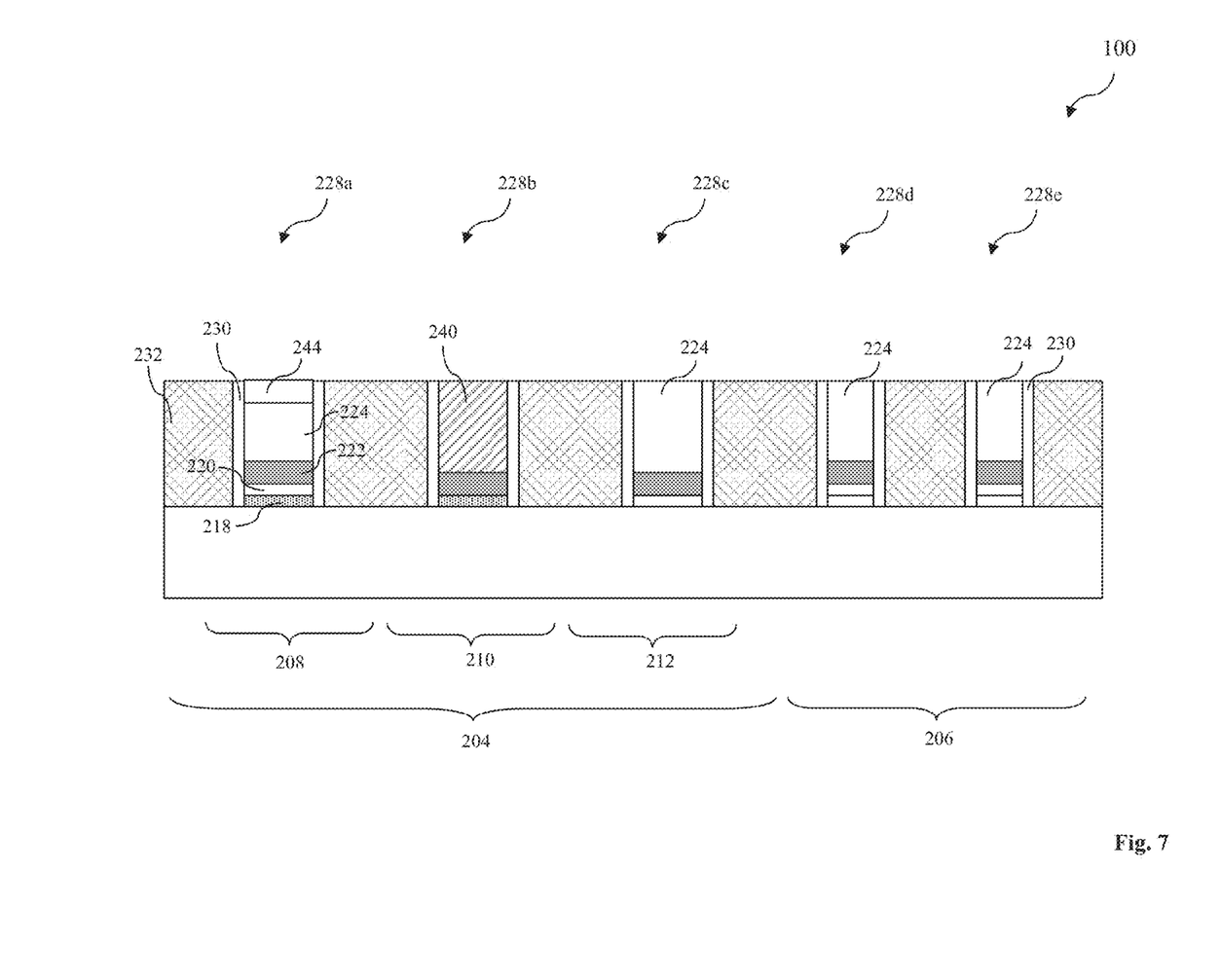

Referring to FIGS. 1 and 7, the method 100 proceeds to step 120 by forming a silicide feature 244 on the polysilicon surface of the gate stack 228a for nFET in the device region 208 with reduced contact resistance. The silicide feature 244 may include nickel silicide, cobalt silicide, tungsten silicide, tantalum silicide, titanium silicide, platinum silicide, erbium silicide, palladium silicide, or combinations thereof. The silicide may be formed by a procedure including depositing a metal ((such as nickel) on the substrate, reacting the metal with polysilicon to form silicide at an elevated temperature (such as through a thermal annealing), and then etching to remove the un-reacted metal. Another annealing process may be followed with a higher temperature and a shorter annealing duration such that the formed silicide is transferred from a high resistive phase to a low resistive phase. In the present embodiment, a patterned mask (photoresist or hard mask) may be formed on the substrate to cover the resistor 228c in the device region 212 such that the surface resistance of the resistor is not unexpectedly changed.

Although not shown, other alternatives and features may present and other processing steps may present to form various features. In one embodiment, the one or more resistors (such as 228c) in the device region 212 can be properly configured and alternatively used as a polysilicon fuse (or amorphous silicon fuse) for other applications. In another embodiment, the resistors are configured as an array, each being disposed on the shallow trench isolation (STI). The semiconductor structure 200 is a portion of an integrated circuit having both plurality of resistors and various field effect transistors where each nFET has a gate stack of high k dielectric and polysilicon gate electrode and each nFET has a gate stack of high k dielectric and metal gate electrode. In another embodiment, the polysilicon layer 224 can be in-situ boron doped during the polysilicon deposition. In furtherance of the embodiment, the in-situ doping is tuned to achieve an expected resistivity of the polysilicon layer 224 so one or more ion implantations may be eliminated.

In another embodiment, the pFET has a strained structure for enhanced carrier mobility and improved device performance. In furtherance of the embodiment, silicon germanium (SiGe) is formed in the source and drain regions of the pFET to achieve a proper stress effect. In one example of forming such a strained pFET, the silicon substrate within the source and drain regions of the pFET are recessed by one or more etching step. Then SiGe is epi grown in the recessed regions and heavy doped source and drain are formed in the epi grown SiGe features. In another example, a dummy spacer is formed after the formation of the LDD features. The dummy spacer is removed after the formation of the SiGe features. Then a main spacer is formed on the sidewalls of the associated gate stack, with a different thickness such that the heavy doped source and drain have an offset from the SiGe features. For instance, the main spacer is thicker than the dummy spacer such that the heavy doped source and drain are formed in the SiGe features.

In another embodiment, the nFET has a strained structure for enhanced carrier mobility and improved device performance. In furtherance of the embodiment, silicon carbide (SiC) is formed in the source and drain regions of the nFET to achieve a proper stress effect. The strained nFET can be formed similarly as the strained pFET is formed. In another embodiment, the gate electrodes for pFET (or nFET) have a multiple conductive layers with an optimized work function and reduced threshold voltage.

In another embodiment, the dummy gates in the second region 206 may have different dimensions. For example, the dummy gates may have a width less or greater than the width of the nFET gate or the pFET gate so that the pattern density may be more flexibly tuned to reduced CMP dishing issue.

Other processing steps may be implemented before, during and/or after the formation of the resistors, the nFETs, and the pFETs. For example, the multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In another embodiment, the high k dielectric layer can be formed by other suitable process such as metal organic chemical vapor deposition (MOCVD), or molecular beam epitaxy (MBE). In one example, the high k dielectric material includes HfO2. In another example, the high k dielectric material includes Al2O3. Alternatively, the high k dielectric material layer includes metal nitrides, metal silicates or other metal oxides. In another example, the interfacial layer (such as silicon oxide) may be formed on the silicon substrate by a thermal oxidation, ALD, UV-Ozone Oxidation or other suitable method.

The various patterning process may include forming a patterned photoresist layer by a lithography process. An exemplary lithography process may include processing steps of photoresist spin-on coating, soft baking, mask aligning, exposing, post-exposure baking, developing photoresist and hard baking. The lithography exposing process may also be implemented or replaced by other proper methods such as maskless lithography, electron-beam writing, ion-beam writing, thermal lithography, and molecular imprint.

Different advantages may be present in various embodiments. In one embodiment, the polysilicon pattern density is a factor to control the high k metal gate (HKMG) gate-last process. A certain level of polysilicon density is required and defined by design rule. Besides the dummy patterns in customer design, additional dummy polysilicon gates are mandatorily inserted in the polysilicon isolated regions. As the dummy gates (e.g., 228d and 228e) are formed in the second region 206 using the gate first process that forms the nFET (e.g., 228a) so that the loading effect of some related processes can be improved.

In another embodiment, the disclosed method is fully compatible with the HKMG gate-last process, the loading effect of the capping layer is improved and the loading effect of metal gate in the device region 210 is improved as well during the CMP process.

The present disclosure is not limited to applications in which the semiconductor structure includes a FET and a polysilicon resistor (or polysilicon fuse), and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Thus, the present disclosure provides one embodiment of an integrated circuit. The integrated circuit includes a semiconductor substrate; a n-type filed effect transistor (nFET) formed on the semiconductor substrate and having a first gate stack including a high k dielectric layer, a capping layer on the high k dielectric layer, a p work function metal on the capping layer, and a polysilicon layer on the p work function metal; and a p-type filed effect transistor (pFET) formed on the semiconductor substrate and having a second gate stack including the high k dielectric layer, the p work function metal on the high k dielectric layer, and a metal material on the p work function metal.

In one embodiment of the integrated circuit, the nFET further comprising a silicide feature formed on the polysilicon feature. In another embodiment, the capping layer includes lanthanum oxide (LaO). In another embodiment, the p work function metal includes titanium nitride (TiN). In another embodiment, the metal material includes aluminum.

In yet another embodiment, each of the nFET and pFET further includes an interfacial layer of silicon oxide disposed between the semiconductor substrate and the high k dielectric layer.

In yet another embodiment, the integrated circuit further includes a resistor formed on the semiconductor substrate and having the high k dielectric layer, the p work function metal on the high k dielectric layer, and the polysilicon feature on the p work function metal.

In yet another embodiment, the integrated circuit further includes at least one dummy gate formed on the semiconductor substrate and having the high k dielectric layer, the capping layer on the high k dielectric layer, the p work function metal on the capping layer, and the polysilicon feature on the p work function metal.

The present disclosure also provides one embodiment of a semiconductor structure. The semiconductor structure includes a semiconductor substrate; a n-type filed effect transistor (nFET) formed on the semiconductor substrate and having a first gate stack including a high k dielectric layer, a capping layer on the high k dielectric layer, a p work function metal on the capping layer, a polysilicon layer on the p work function metal, and a silicide feature on the polysilicon layer; a p-type filed effect transistor (pFET) formed on the semiconductor substrate and having a second gate stack including the high k dielectric layer, the p work function metal on the high k dielectric layer, and a metal material on the p work function metal; and a dummy gate formed on the semiconductor substrate and having the high k dielectric layer, the capping layer on the high k dielectric layer, the p work function metal on the capping layer, and the polysilicon feature on the p work function metal.

In one embodiment, the semiconductor structure further includes a resistor formed on the semiconductor substrate and having the high k dielectric layer, the p work function metal on the high k dielectric layer, and the polysilicon layer on the p work function metal.

In another embodiment, the capping layer includes lanthanum oxide (LaO). In yet another embodiment, the p work function metal includes a material selected from the group consisting of titanium nitride (TiN), tantalum nitride, tungsten nitride (WN) and combination of.

In yet another embodiment, the metal material includes a metal selected from the group consisting of aluminum, copper, tungsten and combination thereof.

In yet another embodiment, each of the nFET and pFET further includes an interfacial layer of silicon oxide disposed between the semiconductor substrate and the high k dielectric layer.

In yet another embodiment, the first gate stack, the second gate stack and the dummy gate stack each include gate spacer disposed on respective gate stack sidewalls. In yet another embodiment, the semiconductor structure further includes an interlayer dielectric (ILD) material formed in gaps of the first gate, the second gate and dummy gate.

The present disclosure also provide an embodiment of a method. The method includes providing a semiconductor substrate having a first region for a n-type field effect transistor (nFET), a second region for a p-type field effect transistor (pFET) and a third region for a dummy gate; forming a high k dielectric layer on a semiconductor substrate in the first, second and third regions; forming a lanthanum oxide capping layer on the high k dielectric layer within the first and second regions; forming a titanium nitride layer on the lanthanum oxide layer in the first and second regions and on the high dielectric layer in the second region; forming a polysilicon layer on the titanium layer in the first, second and second regions; patterning the polysilicon layer, titanium nitride layer, the lanthanum oxide layer and the high k dielectric layer to form a first gate stack in the first region, a second gate stack in the second region and a dummy gate stack in the third region; and replacing the polysilicon layer in the second region by a metal material.

In one embodiment of the method, the replacing the polysilicon layer in the second region by a metal material includes etching the polysilicon layer in the second region, resulting a gate trench; depositing the metal material in the gate trench; and performing a chemical mechanical polishing (CMP) process to the metal material.

In another embodiment, the method further includes forming a silicide on the first gate stack in the first region. In yet another embodiment, the method further includes forming source and drain features in the semiconductor substrate by ion implantation after the patterning the polysilicon layer, titanium nitride layer, the lanthanum oxide layer and the high k dielectric layer; and performing a thermal annealing to the semiconductor substrate to resistor.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
performing a hybrid gate formation process that includes performing a gate first process to form a first gate stack that corresponds to a NMOS transistor and performing a gate last process to form a second gate stack that corresponds to a PMOS transistor, wherein the gate first process includes:
forming a dielectric layer over a semiconductor substrate;
forming a capping layer on the dielectric layer;
patterning the capping layer to expose a portion of the dielectric layer;
forming a first metal layer on the capping layer and on the exposed portion of the dielectric layer, wherein the forming the first metal layer includes depositing a p-type work function metal having a work function value of greater than 5.2 eV;
forming a conductive layer on the first metal layer;
patterning the conductive layer, the first metal layer, the patterned capping layer, and the dielectric layer to form the first gate stack that corresponds to the NMOS transistor, the second gate stack that corresponds to the PMOS transistor, and a third gate stack that corresponds to a dummy structure, and a resistor stack that corresponds to a resistor, wherein the first gate stack and the third gate stack each include the patterned capping layer;
further wherein the gate last process includes replacing the patterned conductive layer of the second gate stack that corresponds to the PMOS transistor with a second metal layer by:
removing at least a portion of the patterned conductive layer from the second gate stack to form a trench;
wherein during the gate last process including the removing the at least the portion of the patterned conductive layer to form the trench, the first metal layer is not removed from the second gate stack;
after removing the at least the portion of the patterned conductive layer, forming the second metal layer in the trench of the second gate stack, wherein the second metal layer is formed directly interfacing the p-type work function metal of the first metal layer in the trench; and
planarizing a top surface of the patterned conductive layer of the first gate stack, a top surface of the second metal layer of the second gate stack, a top surface of the patterned conductive layer of the third gate stack, and a top surface of the patterned conductive layer of the resistor stack; and after performing the gate last process, forming a silicide feature on the patterned conductive layer of the first gate stack without forming a silicide feature on the second gate stack, the third gate stack, and the resistor stack.

2. The method of claim 1, wherein the second gate stack and the resistor stack are without the capping layer.

3. The method of claim 1, wherein the capping layer is formed of a material having an n-type work function, and wherein the first metal layer is formed of a material having a p-type work function.

4. The method of claim 1, wherein the third gate stack that corresponds to the dummy structure is adjacent to the resistor stack that corresponds to the resistor.

5. The method of claim 1, further comprising forming an interlayer dielectric layer over the first, second, third gate stacks and the resistor stack.

6. A method comprising:
forming a high-k dielectric layer over an n-type field effect transistor (nFET) region, a p-type field effect transistor (pFET) region, a resistor region, and a dummy region of a semiconductor substrate;
forming an n-type work function material layer over the high-k dielectric layer in the nFET region, the pFET region, the resistor region, and the dummy region;
removing the n-type work function material layer in the pFET region and the resistor region to expose the high-k dielectric layer in the pFET region and the resistor region while maintaining the n-type work function material layer in the nFET region and the dummy region;
forming a p-type work function material layer over and directly interfacing the n-type work function material layer in the nFET region and the dummy region and over and directly interfacing the high-k dielectric layer in the pFET region and the resistor region, wherein the p-type work function material layer has a work function value of about 5.2 eV or greater;
forming a polysilicon layer over the p-type work function material layer in the nFET region, the pFET region, the resistor region, and the dummy region;
performing a patterning process to form an nFET gate stack in the nFET region and a dummy gate stack in the dummy region, wherein the nFET gate stack and the dummy gate stack include the high-k dielectric layer, the n-type work function material layer, the p-type work function material layer, and a polysilicon gate, and further wherein the patterning process further forms a pFET gate stack in the pFET region that includes the high-k dielectric layer, the p-type work function material layer, and a polysilicon gate and a resistor stack in the resistor region that includes the high-k dielectric layer, the p-type work function material layer, and the polysilicon layer;
thereafter, forming source and drain features in the semiconductor substrate in the nFET region and the pFET region; and
thereafter, performing a gate replacement process to replace the polysilicon gate in the pFET gate stack with a metal gate while maintaining the p-type work function material layer having the work function value under the polysilicon gate in the pFET gate stack during the gate replacement process, such that the pFET gate stack includes the high-k dielectric layer, the p-type work function material layer, and the metal gate formed interfacing the p-type work function material layer, wherein the gate replacement process includes planarizing a top surface of the polysilicon gate of the nFET gate stack, a top surface of the metal gate of the pFET gate stack, a top surface of the polysilicon layer of the resistor stack, and a top surface of the polysilicon gate of the dummy gate stack; and
thereafter, forming a silicide feature on the polysilicon gate of the nFET gate stack without forming a silicide feature on the polysilicon layer of the resistor stack and the polysilicon gate of the dummy gate stack.

7. The method of claim 6, wherein planarizing the top surface of the polysilicon gate of the nFET gate stack, the top surface of the metal gate of the pFET gate stack, and the top surface of the polysilicon gate of the dummy gate stack includes performing a chemical mechanical polishing process.

8. The method of claim 6, wherein the n-type work function material layer includes lanthanum oxide.

9. The method of claim 6, wherein the dummy gate stack is adjacent to the resistor gate stack.

10. A method comprising:
providing a semiconductor substrate having a first region for an n-type field effect transistor (nFET), a second region for a p-type field effect transistor (pFET), and a third region for a dummy gate;
forming a high-k dielectric layer on a semiconductor substrate in the first, second, and third regions;
forming a lanthanum oxide capping layer on the high-k dielectric layer within the first, second, and third regions;
removing the lanthanum oxide capping layer from the second region;
forming a titanium nitride layer having a work function of about 5.2 eV or higher on the lanthanum oxide layer in the first and third regions and on the high-k dielectric layer in the second region;
forming a polysilicon layer on the titanium nitride layer in the first, second, and third regions;
thereafter, patterning the polysilicon layer, titanium nitride layer, the lanthanum oxide layer, and the high-k dielectric layer to form an nFET gate stack in the first region, a pFET gate stack in the second region, and a dummy gate stack in the third region;
thereafter, forming source and drain features in the semiconductor substrate in the first region and the second region;
thereafter, forming an inter-level dielectric (ILD) layer over the first region, the second region, and the third region;
thereafter, replacing the polysilicon layer of the pFET gate stack in the second region with a metal layer wherein the titanium nitride layer is maintained in the pFET gate stack during the replacing the polysilicon such that the metal layer is disposed directly on the titanium nitride layer, and such that the nFET gate stack and the dummy gate stack include a polysilicon gate on the titanium nitride layer; and
thereafter, forming a silicide feature on the polysilicon gate of the nFET gate stack without forming a silicide feature on the polysilicon gate of the dummy gate stack.

11. The method of claim 10, wherein the replacing the polysilicon layer of the pFET gate stack with the a metal includes:
etching the polysilicon layer in the second region, resulting in a gate trench;
depositing a metal material in the gate trench; and
performing a chemical mechanical polishing (CMP) process to remove excessive metal material.

12. The method of claim 10, wherein forming the source and drain features includes:
- performing an ion implantation after patterning the polysilicon layer, titanium nitride layer, the lanthanum oxide layer, and the high-k dielectric layer; and
- performing a thermal annealing upon the semiconductor substrate.

13. The method of claim 10, further comprising planarizing a top surface of the polysilicon layer of the nFET gate stack and a top surface of the polysilicon layer of the dummy gate stack.

14. The method of claim 6, wherein the nFET region, the pFET region, and the resistor region form an active region of the semiconductor substrate, such that the nFET gate stack, the pFET gate stack, and the resistor stack are disposed on an active region of the substrate.

15. The method of claim 14, wherein the resistor stack is not disposed on an isolation feature formed in the semiconductor substrate.

16. The method of claim 1, wherein the resistor is formed on an active region of the semiconductor substrate.

17. The method of claim 10, wherein the semiconductor substrate further includes a fourth region for a resistor, the method further comprising:
- forming the high-k dielectric layer on the semiconductor substrate in the fourth region;
- forming the titanium nitride layer on the high-k dielectric layer in the fourth region;
- forming the polysilicon layer on the titanium nitride layer in the fourth region;
- thereafter, patterning the polysilicon layer, the titanium nitride layer, and the high-k dielectric layer to form a resistor stack in the fourth region;
- thereafter, forming the ILD layer over the fourth region; and
- further wherein no silicide feature is formed on the polysilicon layer of the resistor stack.

* * * * *